United States Patent
Wang

(10) Patent No.: US 10,940,645 B2
(45) Date of Patent: Mar. 9, 2021

(54) VIBRATION HEAT-PRESSING DEVICE

(71) Applicant: TRIPLE WIN TECHNOLOGY(SHENZHEN) CO. LTD., Shenzhen (CN)

(72) Inventor: Hong-Kun Wang, New Taipei (TW)

(73) Assignee: TRIPLE WIN TECHNOLOGY(SHENZHEN) CO. LTD., Shenzhen (CN)

(*) Notice: Subject to any disclaimer, the term of this patent is extended or adjusted under 35 U.S.C. 154(b) by 0 days.

(21) Appl. No.: 16/532,729

(22) Filed: Aug. 6, 2019

(65) Prior Publication Data
US 2020/0384700 A1 Dec. 10, 2020

(30) Foreign Application Priority Data
Jun. 5, 2019 (CN) .......................... 201910484470.2

(51) Int. Cl.
B32B 37/00 (2006.01)
B29C 65/00 (2006.01)
B29C 65/08 (2006.01)
B23K 20/10 (2006.01)

(52) U.S. Cl.
CPC ............. *B29C 66/01* (2013.01); *B23K 20/10* (2013.01); *B29C 65/08* (2013.01); *B29C 66/8145* (2013.01)

(58) Field of Classification Search
USPC .......................................... 156/580.1, 583.1
See application file for complete search history.

(56) References Cited

U.S. PATENT DOCUMENTS

| 6,439,447 B1 | 8/2002 | Minamitani et al. |
| 6,460,591 B1* | 10/2002 | Gotoh ............... H01L 24/75 156/359 |
| 8,627,869 B1* | 1/2014 | Matsumoto ............ B29C 65/02 156/553 |

FOREIGN PATENT DOCUMENTS

| CN | 1144278 C | 3/2004 |
| CN | 104937788 A | 9/2015 |
| CN | 208742462 U | 4/2019 |

* cited by examiner

*Primary Examiner* — James D Sells
(74) *Attorney, Agent, or Firm* — ScienBiziP, P.C.

(57) ABSTRACT

A vibration heat-pressing device includes a positioning member, a support body, a pressing mechanism, a vibration generator, and a heating rod. The positioning member supports and positions the workpiece. The pressing mechanism, the vibration generator, and the heating rod are located on the support body. The support body defines a first mounting hole. The heating rod is engaged in the first mounting hole. One end of the heating rod extends out from the support body and is connected to a heating device. The heating rod heats the heating rod of the pressing mechanism. A heat-conducting medium is filled in a gap between the heating rod and an inner wall of the first mounting hole. While heating rod of the pressing mechanism are heated, the vibration generator vibrates the pressing mechanism.

14 Claims, 3 Drawing Sheets

VIBRATION HEAT-PRESSING DEVICE

FIELD

The subject matter herein generally relates to a vibration heat-pressing device for combining components of a workpiece.

BACKGROUND

Vibration is widely used in a process of combining electronic components. However, high temperature and a high frequency of vibration may cause dust particles to contaminate the electronic components.

BRIEF DESCRIPTION OF THE DRAWINGS

Implementations of the present disclosure will now be described, by way of embodiments, with reference to the attached figures.

DETAILED DESCRIPTION

Figure 1:
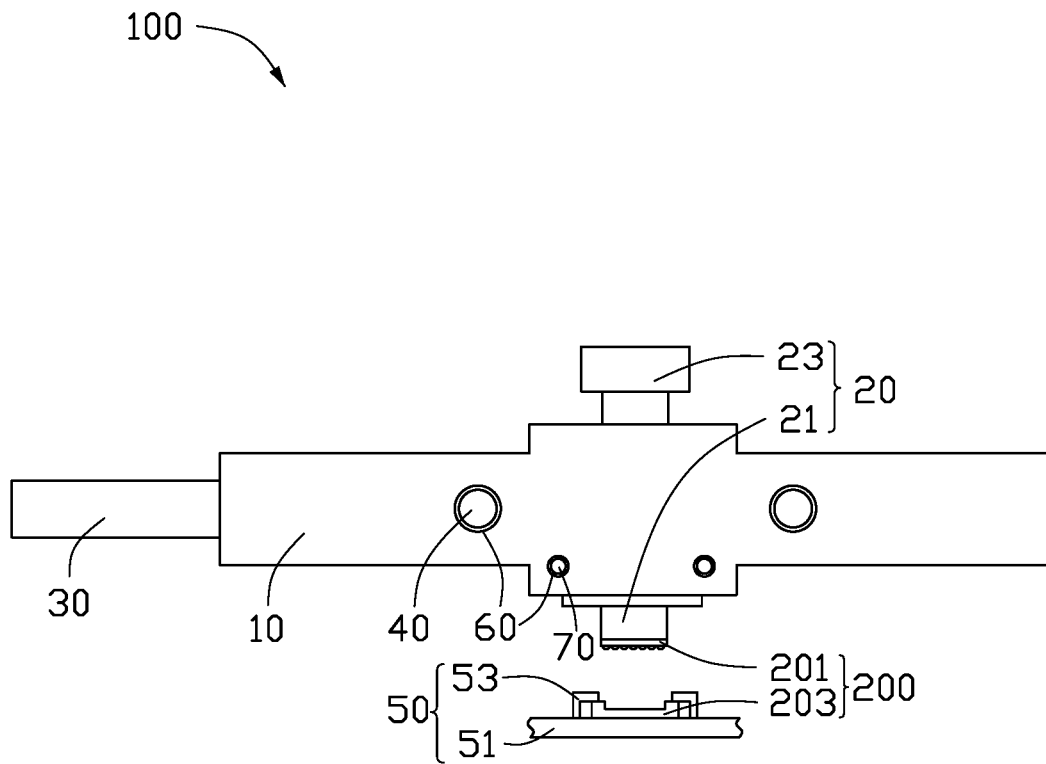
FIG. 1 is a top-view diagram of an embodiment of a vibration heat-pressing device.

It will be appreciated that for simplicity and clarity of illustration, where appropriate, reference numerals have been repeated among the different figures to indicate corresponding or analogous elements. Additionally, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "comprising" means "including, but not necessarily limited to"; it specifically indicates open-ended inclusion or membership in a so-described combination, group, series and the like.

Figure 3:
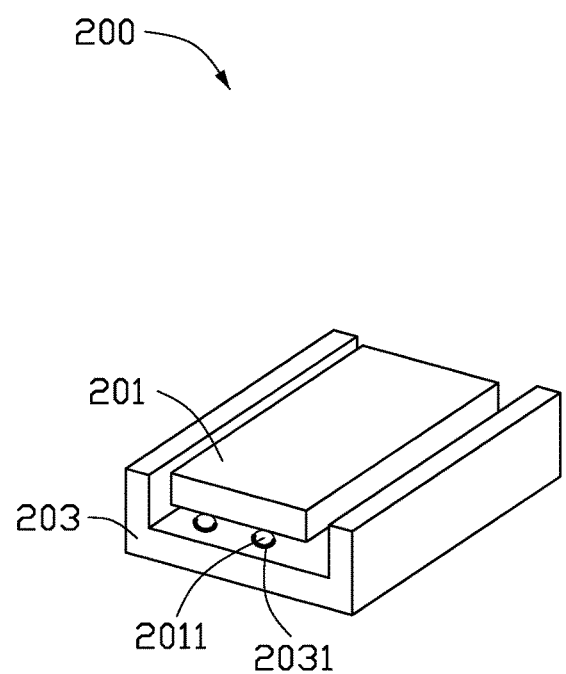
FIG. 3 is an isometric view of a workpiece.

FIG. 1 shows an embodiment of a vibration heat-pressing device 100 for processing a workpiece 200 to combine components therein. Specifically, the workpiece 200 includes a first welding member 201 and a second welding member 203. In one embodiment, the first welding member 201 is an internal chip of a camera, and the second welding member 203 is a ceramic substrate. The first welding member 201 is provided with solder balls 2011 (shown in FIG. 3), and the second welding member 203 is correspondingly provided with solder pads 2031 (shown in FIG. 3). Heating the solder balls 2011 enables the solder balls 2011 to be bonded to the solder pads 2031.

Referring to FIG. 1, the vibration heat-pressing device 100 includes a support body 10, a pressing mechanism 20, a vibration generator 30, a heating rod 40, and a positioning member 50. The support body 10 and the positioning member 50 are located on a machining table (not shown). In one embodiment, the positioning member 50 is used to carry and position the second welding member 203 of the workpiece 200. Specifically, the positioning member 50 includes a platform 51 and a plurality of pressing members 53. The platform 51 is located on the machining platform and is used to carry the second welding member 203. A plurality of the pressing members 53 is located on the platform 51. The pressing members 53 abut the second welding member 203 on the platform 51 to make the second welding member 203 and the platform 51 is relatively fixed.

The pressing mechanism 20, the vibration generator 30, and the heating rods 40 are located on the support body 10. The pressing mechanism 20 includes a pressing head 21 and a driving member 23. The pressing head 21 is slidably located on the support body 10. The driving member 23 is located on a side of the supporting body 10 facing away from the positioning member 50. The pressing head 21 defines a through hole (not shown) facing the positioning member 50. The through hole is coupled to a suction device (not shown) to adsorb the first welding member 201. The driving member 23 drives the pressing head 21 and the first welding member 201 to move toward or away from the positioning member 50. The heating rod 40 is located on the support body 10. One end of the heating rod 40 extends out from the support body 10 to be coupled to a heating device (not shown). The heating rod 40 is coupled to the pressing head 21 to heat the pressing head 21. The pressing head 21 is thermally conductive to heat the first welding member 201. The vibration generator 30 is located on one side of the support body 10 and is used to drive the pressing head 21 to vibrate. In one embodiment, the vibration generator 30 is an ultrasonic vibration generator. In other embodiments, the vibration generator 30 may also be an electromagnetic vibrator.

In operation, the suction device draws air into the pressing head 21. The pressing head 21 adsorbs the first welding member 201 through the through hole. The driving member 23 drives the pressing head 21 and the first welding member 201 to move toward the second welding member 203 on the positioning member 50, and presses the second welding member 203 onto the first welding member 201. The heating device heats the heating rod 40. The vibration generator 30 is turned on to drive the pressing head 21 to vibrate while pressing the first welding member 201. The heating rod 40 and the pressing head 21 sequentially conduct heat to heat the first welding member 201. The solder balls 2011 on the first soldering member 201 are vibrated on the solder pads 2031, and the solder balls 2011 are melted and bonded to the solder pads 2031 by abrasive heating.

The vibration causes the solder pads and the solder balls 2011 to generate heat by friction, thereby further promoting melting of the solder balls 2011. Ultrasonic vibration promotes diffusion of atoms to form intermetallic compounds required for reliable solder joints in a short period of time, thereby shortening processing time and improving production efficiency.

In one embodiment, the driving member 23 is an air cylinder. In other embodiments, the driving member 23 may be other mobile driving structures such as an electric cylinder.

It should be understood that in other embodiments, the positioning member 50 can position the whole workpiece 200, that is, the second welding member 203 is fixed on the positioning member 50, and the first welding member 201 is placed on the second welding member 203 and circumferentially positioned on the positioning member 50. The pressing head 21 moves against the first welding member 201 toward the second welding member 203.

Figure 2:
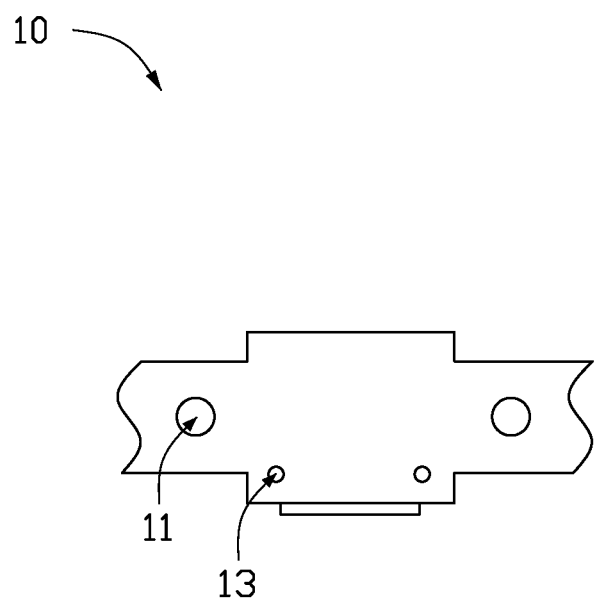
FIG. 2 is a top-view diagram of a support body of the vibration heat-pressing device in FIG. 1.

Referring to FIG. 1 and FIG. 2, in one embodiment, a quantity of the heating rods 40 is two. The support body 10 correspondingly defines two first mounting holes 11. Each of the heating rods 40 is engaged in the corresponding first mounting hole 11. Each first mounting hole 11 is filled with a heat-conducting medium 60 to fill in a gap between the heating rod 40 and an inner wall of the first mounting hole 11. The heat-conducting medium 60 fills in two ends of the first mounting hole 11, and the heating rod 40 protrudes through one end of the support body 10.

The vibration heat-pressing device 100 further includes a probe 70. In one embodiment, a quantity of the probe 70 is two.

Two second mounting holes 13 are defined in the support body 10. Each of the probes 70 is engaged in the corresponding second mounting hole 13 and is used to detect a temperature of the pressing head 21. The second mounting hole 13 is filled with the heat-conducting medium 60 to fill in a gap between the probe 70 and an inner wall of the second mounting hole 13. The heat-conducting medium 60 fills in two ends of the second mounting hole 13.

The heat-conducting medium 60 is in a gel form before curing. After curing, the heat-conducting medium 60 has functions of heat conduction, bonding, fixing, waterproofing, high temperature resistance, hot and cold transition resistance, aging resistance, electrical insulation, moisture resistance, shock resistance, and leakage resistance. The heat-conducting medium 60 can reduce friction generated on the heating rods 40, the first mounting holes 11, the probes 70, and the second mounting holes 13 when the vibration generator 30 is turned on. The heat-conducting medium 60 prevents particles generated by friction in the first mounting holes 11 and the second mounting holes 13 from overflowing and contaminating a production environment of the workpiece 200, thereby improving production yield of the workpiece 200.

The table below shows a number of particles found in the vibration heat-pressing device 100 before and after providing the conductive silica gel 60.

| Particle size | Without heat-conducting medium | With heat-conducting medium | | |
|---|---|---|---|---|
| | | First vibration heat-pressing device | Second vibration heat-pressing device | Third vibration heat-pressing device |
| 0.3 µm | 3980 | 19 | 30 | 5 |
| 0.5 µm | 964 | 4 | 11 | 2 |
| 1.0 µm | 524 | 0 | 0 | 0 |
| 3.0 µm | 63 | 0 | 0 | 0 |
| 5.0 µm | 6 | 0 | 0 | 0 |
| 10.0 µm | 1 | 0 | 0 | 0 |

According to the above table, when the first mounting hole 11 and the second mounting hole 13 are not provided with the heat-conducting medium 60, the number of particles having a particle size of more than 1.0 µm is greater than 500. When the first mounting hole 11 and the second mounting hole 13 are provided with the heat-conducting medium 60, there are no particles having a particle diameter of less than 1.0 Although the particles of smaller particle size were still present, the average number of particles having a particle size of 0.3 µm was reduced by 99.5% by using the heat-conducting medium 60.

The heat-conducting medium 60 does not produce particles.

The vibration heat-pressing device 100 drives the pressing mechanism 20 to vibrate and press the first welding member 201 by using the vibration generator 30, thereby promoting melting of the solder balls 2011 and improving production efficiency. The first mounting holes 11 and the second mounting holes 13 are filled in with the heat-conducting medium 60, and particles formed by friction generated by the vibration generator 30 are reduced, thereby improving production yield of the workpiece 200.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:

1. A vibration heat-pressing device comprising:
   a positioning member supporting and positioning a workpiece, the positioning member being located on a surface;
   a support body located on the surface;
   a pressing mechanism located on the support body;
   a vibration generator located on the support body; and
   a heating rod located on the support body; wherein:
   the positioning member comprises a platform supporting the workpiece and a plurality of pressing members positioning the workpiece on the platform;
   the pressing mechanism comprises a pressing head slidably located on the support body and connected to the heating rod;
   the support body defines a first mounting hole;
   the heating rod is engaged in the first mounting hole;
   one end of the heating rod extends out from the support body and is connected to a heating device;
   the heating device heats the heating rod, and the heating rod heats the pressing head of the pressing mechanism;
   a heat-conducting medium is filled in a gap between the heating rod and an inner wall of the first mounting hole;
   while the pressing head of the pressing mechanism is heated, the vibration generator vibrates the pressing mechanism.

2. The vibration heat-pressing device of claim 1, wherein:
   the pressing mechanism further comprises a driving member;
   the driving member is located on a side of the support body facing away from the positioning member;
   the driving member is configured for driving the pressing head to move toward or away from the positioning member.

3. The vibration heat-pressing device of claim 2, wherein:
   the positioning member is configured to fix the second welding member;
   the pressing head defines a through hole facing the positioning member;
   the pressing head is adapted for adhering the first welding member by the a suction device.

4. The vibration heat-pressing device of claim 2, further comprising a probe for detecting a temperature of the pressing head, wherein:
the support body defines a second mounting hole;
the probe is engaged in the second mounting hole;
the heat-conducting medium is further filled in the second mounting hole;
the heat-conducting medium further fills in a gap between the probe and an inner wall of the second mounting hole.

5. The vibration heat-pressing device of claim 3, wherein:
the positioning member is configured to fix and receive a second welding member, the first welding member is located on the second welding member;
the positioning member is configured to circumferentially position the first welding member;
the pressing head is drivable by the driving member to press and move the first welding member towards the second welding member.

6. The vibration heat-pressing device of claim 2, wherein:
the driving member is an air cylinder.

7. The vibration heat-pressing device of claim 1, wherein:
the vibration generator is an ultrasonic vibration generator.

8. A vibration heat-pressing device comprising:
a positioning member supporting and positioning a second welding member of a workpiece, the positioning member being located on a surface;
a support body supporting and positioning a first welding member of the workpiece, the support body being located on the surface;
a pressing mechanism on the support body;
a vibration generator on the support body; and
a heating rod on the support body; wherein:
the positioning member comprises a platform supporting the workpiece and a plurality of pressing members positioning the workpiece on the platform;
the pressing mechanism comprises a pressing head slidably located on the support body and connected to the heating rod;
the support body defines a first mounting hole;
the heating rod is engaged in the first mounting hole;
one end of the heating rod extends out from the support body and is connected to a heating device;
the heating device heats the heating rod, and the heating rod heats the pressing head of the pressing mechanism;
a heat-conducting medium is filled in the first mounting hole;
the heat-conducting medium is filled in a gap between the heating rod and an inner wall of the first mounting hole;
while the pressing head of the pressing mechanism is heated for combining the first welding member and the second welding member, the vibration generator vibrates the pressing mechanism for vibrating the first welding member.

9. The vibration heat-pressing device of claim 8, wherein:
the first welding member comprises solder balls;
the second welding member comprises solder pads;
when the first welding member is pressed and vibrated by the pressing mechanism, the solder balls melt onto the solder pads to combine the first welding member and the second welding member.

10. The vibration heat-pressing device of claim 9, wherein:
the pressing mechanism further comprises a driving member;
the driving member is located on a side of the support body facing away from the positioning member;
the driving member is capable of driving the pressing head to move toward or away from the positioning member.

11. The vibration heat-pressing device of claim 10, wherein:
the pressing head defines a through hole facing the positioning member;
the pressing head is configured to adhere to the first welding member through the through hole.

12. The vibration heat-pressing device of claim 8, further comprising a probe for detecting a temperature of the pressing head, wherein:
the support body defines a second mounting hole;
the probe is engaged in the second mounting hole;
a heat-conducting medium is filled in the second mounting hole;
the heat-conducting medium further fills in a gap between the probe and an inner wall of the second mounting hole.

13. The vibration heat-pressing device of claim 10, wherein:
the driving member is an air cylinder.

14. The vibration heat-pressing device of claim 8, wherein:
the vibration generator is an ultrasonic vibration generator.

* * * * *